(12) United States Patent
Park

(10) Patent No.: US 8,486,813 B2
(45) Date of Patent: Jul. 16, 2013

(54) SILICON WAFER AND FABRICATION METHOD THEREOF

(75) Inventor: Jung-Goo Park, Cheonju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 26 days.

(21) Appl. No.: 13/150,493

(22) Filed: Jun. 1, 2011

(65) Prior Publication Data

US 2011/0227202 A1  Sep. 22, 2011

Related U.S. Application Data

(62) Division of application No. 12/500,901, filed on Jul. 10, 2009, now Pat. No. 7,977,216.

(30) Foreign Application Priority Data

Sep. 29, 2008 (KR) .................. 10-2008-0095462
Jan. 16, 2009 (KR) .................. 10-2009-0003697

(51) Int. Cl.
*H01L 21/322* (2006.01)
*H01L 21/36* (2006.01)
*H01L 21/20* (2006.01)
*H01L 21/461* (2006.01)
*H01L 21/302* (2006.01)
*H01L 21/324* (2006.01)

(52) U.S. Cl.
USPC ........... 438/509; 438/477; 438/479; 438/689; 438/795; 438/799; 257/E21.321; 257/E21.324

(58) Field of Classification Search
USPC .................... 257/E21.324, E21.321
See application file for complete search history.

(56) References Cited

U.S. PATENT DOCUMENTS 5,693,976 A 12/1997 Chao
5,738,942 A * 4/1998 Kubota et al. ............. 428/428
(Continued)

FOREIGN PATENT DOCUMENTS

CN 1591781 A 3/2005
JP 02007437 1/1990
(Continued)

OTHER PUBLICATIONS

Office Action issued by the Chinese Patent Office for counterpart Chinese Patent Application No. 200910174525.6 issued on Jan. 31, 2012.

(Continued)

*Primary Examiner* — Mohsen Ahmadi
(74) *Attorney, Agent, or Firm* — NSIP Law

(57) ABSTRACT

A silicon wafer and fabrication method thereof are provided. The silicon wafer includes a first denuded zone formed with a predetermined depth from a top surface of the silicon wafer, the first denuded zone being formed with a depth ranging from approximately 20 μm to approximately 80 μm from the top surface, and a bulk area formed between the first denuded zone and a backside of the silicon wafer, the bulk area having a concentration of oxygen uniformly distributed within a variation of 10% over the bulk area.

20 Claims, 18 Drawing Sheets

U.S. PATENT DOCUMENTS

| | | | |
|---|---|---|---|
| 5,885,905 A * | 3/1999 | Nadahara et al. | 438/795 |
| 6,599,815 B1 | 7/2003 | Yang | |
| 6,642,123 B2 | 11/2003 | Mun et al. | |
| 6,686,260 B2 | 2/2004 | Falster et al. | |
| 7,078,357 B2 | 7/2006 | Tobe et al. | |
| 7,242,075 B2 | 7/2007 | Mun et al. | |
| 7,521,382 B2 | 4/2009 | Falster et al. | |
| 2002/0179006 A1 | 12/2002 | Borgini et al. | |
| 2005/0054124 A1 | 3/2005 | Mun et al. | |
| 2005/0164438 A1 | 7/2005 | Okonogi et al. | |
| 2006/0075960 A1 | 4/2006 | Borgini et al. | |
| 2007/0169688 A1 | 7/2007 | Yoon et al. | |
| 2007/0269338 A1 * | 11/2007 | Kume et al. | 420/578 |
| 2008/0075138 A1 | 3/2008 | Wee et al. | |
| 2009/0197396 A1 | 8/2009 | Qu | |

FOREIGN PATENT DOCUMENTS

| | | |
|---|---|---|
| JP | 05218051 | 8/1993 |
| JP | 2000114176 | 4/2001 |
| KR | 10-2003-0097601 | 12/2003 |
| KR | 10 2005 0024994 A | 3/2005 |
| KR | 10 2006 0072691 A | 6/2006 |
| WO | WO 98/38675 | 9/1998 |

OTHER PUBLICATIONS

Izunome et al., Oxygen precipitation in Czochralski-grown silicon wafers during hydrogen annealing, Jan. 1, 1996, Appl. Phys. Lett., vol. 68, No. 1, pp. 49-50.

Poggi et al., "Denuded Zone Stability in a SPAD Diode as a Function of Out-Diffusion Parameters", IEEE Transaction on Electron Devices, vol. ED-34, No. 7, Jul. 1987.

Extended European Search Report issued on Jan. 28, 2011, in corresponding European Application No. 09 25 2132 (9 pages).

Craven et al., "Internal Gettering in Silicon," *Solid State Technology*, vol. 24, No. 7, Jul. 1981, pp. 55-61.

Graff et al., "Monitoring of Internal Gettering during Bipolar Processes," *Journal of the Electrochemical Society*, vol. 135, No. 4, Apr. 1988, pp. 952-957.

Swaroop, "Advances in Silicon Technology for the Semiconductor Industry," *Solid State Technology*, vol. 26, No. 7, Jul. 1983, pp. 97-101.0.

Korean Office Action issued in Korean Patent Application No. 10-2009-003697, dated Oct. 26, 2010.

Taiwanese Office Action issued Jan. 12, 2012 in counterpart Taiwanese Patent Application No. 098130435 (7 pages, in Taiwanese).

* cited by examiner

SILICON WAFER AND FABRICATION METHOD THEREOF

CROSS-REFERENCE TO RELATED APPLICATIONS

This application is a division of application Ser. No. 12/500,901, filed on Jul. 10, 2009 and claims the benefit under 35 U.S.C. §119(a) of Korean Patent Application Nos. 10-2008-0095462, filed on Sep. 29, 2008, and 10-2009-0003697, filed on Jan. 16, 2009, in the Korean Intellectual Property Office, the entire disclosures of which are incorporated herein by reference for all purposes.

BACKGROUND

1. Field

The following description relates to semiconductor fabricating technology, and more particularly, to a silicon wafer and a method for fabricating the same.

2. Description of Related Art

In most high-voltage devices such as NMOS transistors and PMOS transistors, a well is formed to a depth of approximately 5-10 μm from a surface of a substrate generally. It is difficult to achieve a doping profile of a well having a depth of 5-10 μm only using an ion implantation process. For this reason, a dopant diffusion process should be necessarily performed using high-temperature heat treatment after the ion implantation process.

However, an oxygen precipitation is not completely achieved in a silicon bulk due to the high-temperature heat treatment. This causes crystal defects such as a ring-shaped dislocation to occur in a silicon substrate after an etching process for shallow trench isolation (STI).

In addition, these crystal defects reduce production yield, and also deteriorate electrical parameter characteristics such as a threshold voltage of a high voltage device and leakage current uniformity during a standby mode of a static random access memory (SRAM). Furthermore, these crystal defects increase a time taken to inspect and analyze many defects during an impurity inspection process that is inevitably performed to fabricate a semiconductor device, resulting in an increase in an overall processing time for fabricating the semiconductor device.

SUMMARY

In one general aspect, there is provided a silicon wafer, including a first denuded zone formed with a predetermined depth from a top surface of the silicon wafer, the first denuded zone being formed with a depth ranging from approximately 20 μm to approximately 80 μm from the top surface, and a bulk area formed between the first denuded zone and a backside of the silicon wafer, the bulk area having a concentration of oxygen uniformly distributed within a variation of 10% over the bulk area.

The general aspect of the silicon wafer may further provide that a density of a bulk micro defect (BMD) in the bulk area ranges from approximately $1 \times 10^5$ ea/cm$^2$ to approximately $1 \times 10^7$ ea/cm$^2$.

The general aspect of the silicon wafer may further provide that a concentration of oxygen in the bulk area ranges from approximately 10.5 to approximately 13 PPMA (Parts Per Million Atom).

The general aspect of the silicon wafer may further provide an epitaxial layer formed over the top surface of the silicon wafer through an epitaxial growth.

The general aspect of the silicon wafer may further provide a second denuded zone formed below the bulk area with a predetermined depth from the backside in a direction of the top surface.

The general aspect of the silicon wafer may further provide that the second denuded zone is formed with a depth ranging from approximately 20 μm to approximately 80 μm from the backside.

In another general aspect, there is provided a method of fabricating a silicon wafer, including providing the silicon wafer having a denuded zone and a bulk area, performing a first annealing process on the silicon wafer at a first temperature to supplementally generate oxygen precipitate nuclei and oxygen precipitates in the bulk area, and performing a second annealing process on the silicon wafer at a second temperature higher than the first temperature to enlarge the oxygen precipitates in the bulk area.

The general aspect of the method may further provide that the first annealing process is performed at a temperature ranging from approximately 750° C. to approximately 800° C.

The general aspect of the method may further provide that the second annealing process is performed at a temperature ranging from approximately 1000° C. to approximately 1150° C.

The general aspect of the method may further provide that the providing of the silicon wafer includes performing a first thermal process on the silicon wafer at a third temperature equal to or less than the second temperature to form the denuded zone and the bulk area, and performing a second thermal process on the silicon wafer at a fourth temperature greater than the first temperature and less than the third temperature to form the oxygen precipitate nuclei in the bulk area.

The general aspect of the method may further provide that the first and second thermal processes are performed by a rapid thermal process (RTP) or an annealing process.

The general aspect of the method may further provide that the first thermal process is performed at a temperature ranging from approximately 1050° C. to approximately 1150° C., and the second thermal process is performed at a temperature ranging from approximately 950° C. to approximately 1000° C.

The general aspect of the method may further provide that the first and second thermal processes use an argon (Ar) gas, a nitrogen ($N_2$) gas, an ammonia ($NH_3$) gas, or a combination thereof.

The general aspect of the method may further provide that the providing of the silicon wafer includes performing a thermal process on the silicon wafer at a third temperature equal to or less than the second temperature to form the denuded zone and the bulk area.

The general aspect of the method may further provide that the thermal process is performed at a temperature ranging from approximately 1050° C. to approximately 1150° C.

The general aspect of the method may further provide that the providing of the silicon wafer includes performing a thermal process on the silicon wafer at a third temperature greater than the first temperature and less than the second temperature to form the denuded zone and the bulk area.

The general aspect of the method may further provide that the thermal process is performed at a temperature ranging from approximately 950° C. to approximately 1000° C.

The general aspect of the method may further provide that the first and second annealing processes are performed under oxygen ($O_2$) gas atmosphere.

The general aspect of the method may further provide that each of the first and second annealing processes is performed for approximately 100 minutes to approximately 180 minutes.

The general aspect of the method may further provide that the denuded zone is formed with a depth ranging from approximately 20 µm to approximately 80 µm from a top surface of the silicon wafer.

The general aspect of the method may further provide that, after the performing of the second annealing process, a density of a bulk micro defect (BMD) including the oxygen precipitates in the bulk area is controlled to range from approximately $1 \times 10^5$ ea/cm² to approximately $1 \times 10^7$ ea/cm².

The general aspect of the method may further provide that, after the performing of the second annealing process, a concentration of oxygen in the bulk area is controlled to be uniformly distributed within a variation of 10% over the bulk area.

The general aspect of the method may further provide that, after the performing of the second annealing process, a concentration of oxygen in the bulk area is controlled to range from approximately 10.5 to approximately 13 PPMA.

The general aspect of the method may further provide removing an oxide layer formed over a top surface of the silicon wafer during the second annealing process, and forming an epitaxial layer over the top surface of the silicon wafer through an epitaxial growth.

The general aspect of the method may further provide forming a well in the silicon wafer by using an oxide layer as a buffer layer, the oxide layer being formed over a top surface of the silicon wafer during the second annealing process.

The general aspect of the method may further provide that the providing of the silicon wafer includes growing a single crystalline silicon, slicing the grown single crystalline silicon in a shape of wafer, and performing an etching process to etch surface of the sliced silicon wafer or to round a side of the sliced silicon wafer.

Other features and aspects may be apparent from the following detailed description, the drawings, and the claims.

Figure 1:
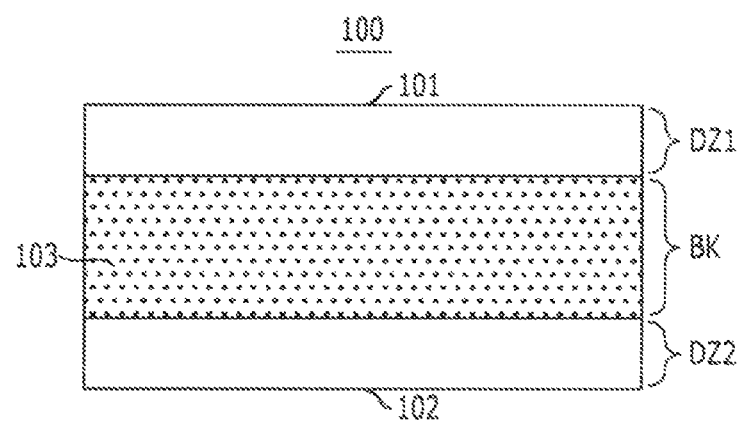
FIG. 1 is a cross-sectional view illustrating an example of a silicon wafer.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It is understood that the features of the present disclosure may be embodied in different forms and should not be constructed as limited to the example embodiment(s) set forth herein. Rather, embodiment(s) are provided so that this disclosure will be thorough and complete, and will convey the full scope of the present disclosure to those skilled in the art. The drawings may not be necessarily to scale, and, in some instances, proportions may have been exaggerated in order to clearly illustrate features of the embodiment(s). When a first layer is referred to as being "on" a second layer or "on" a substrate, it may not only refer to a case where the first layer is formed directly on the second layer or the substrate but may also refer to a case where a third layer exists between the first layer and the second layer or the substrate.

FIG. 1 is a cross-sectional view illustrating an example of a silicon wafer 100. As shown in FIG. 1, the silicon wafer 100 includes a first denuded zone DZ1 formed with a predetermined depth from a top surface 101, and a bulk area BK formed between the first denuded zone DZ1 and a backside 102. The silicon wafer 100 further includes a second denuded zone DZ2 formed with a predetermined depth from the backside 102 in the direction of the top surface 101.

The first denuded zone DZ1 formed with a predetermined depth from the top surface 101 in the direction of the backside 102 is a defect free zone (DFZ) which is free from crystal defects such as vacancy and dislocation. The first denuded zone DZ1 may be formed with a depth ranging from approximately 20 μm to approximately 80 μm from the top surface 101 in the direction of the backside 102.

The second denuded zone DZ2 is also a DFZ and formed with the same depth as that of the first denuded zone DZ1 from the backside 102 in the direction of the top surface 101, or formed with a depth smaller than that of the first denuded zone DZ1 according to a polishing process to the backside 102. That is, when both the top surface 101 and the backside 102 of the silicon wafer 100 are mirror-polished without discrimination, the first and second denuded zones DZ1 and DZ2 are formed with the same depth. On the contrary, when the top surface 101 is mirror-polished and the backside 102 is not mirror-polished, the second denuded zone DZ2 is formed with a depth smaller than that of the first denuded zone DZ1 because oxygen precipitates are formed to close to the backside 102 according to roughness of the backside 102.

The bulk area BK formed between the first and second denuded zones DZ1 and DZ2 includes Bulk Micro-Defects (BMDs) 103. The BMDs 103 are uniformly maintained in the whole bulk area. The BMDs 103 include a precipitate and a bulk stacking fault. Further, the BMDs 103 in the bulk area BK may be controlled to have sufficient density, thereby gettering metallic contaminations to be diffused over the surface of the silicon wafer through a following high-temperature heat treatment process or a thermal process. The BMDs 103 in the bulk area BK may maintain the density from approximately $1\times10^5$ ea/cm$^2$ to approximately $1\times10^7$ ea/cm$^2$, and, for example, from approximately $1\times10^6$ ea/cm$^2$ to $1\times10^7$ ea/cm$^2$. A concentration of oxygen (hereinafter being referred to as an 'oxygen concentration') in the bulk area BK is closely related to the oxygen precipitates, and the oxygen concentration may be distributed within a variation of 10% over the bulk area BK and maintained from approximately 10.5 to approximately 13 PPMA (Parts Per Million Atom).

Figure 2:
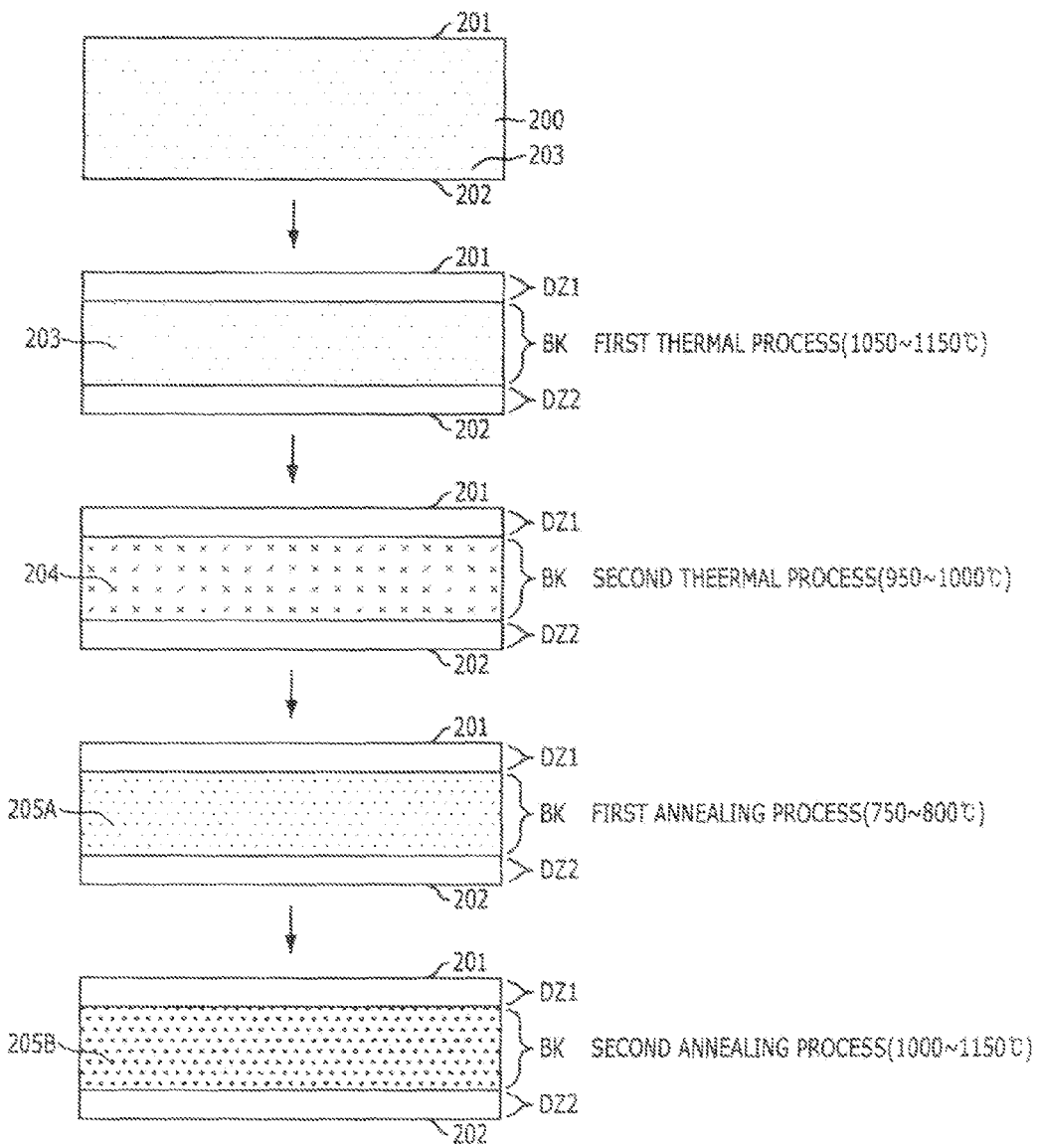
FIG. 2 is a cross-sectional view illustrating an example of a method for fabricating a silicon wafer.

FIG. 2 is a cross-sectional view illustrating an example of a method for fabricating a silicon wafer 200. Referring to FIG. 2, a silicon wafer 200 is prepared. At this time, the silicon wafer 200 may be a bare wafer. The silicon wafer 200 may be formed as is provided in the following steps. First, after growing single crystalline silicon, the single crystalline silicon is sliced in a shape of wafer. After an etching process is performed to etch surface of the sliced wafer or to round side of the sliced wafer, a top surface 201 and a backside 202 of the silicon wafer 200 are mirror-polished. At this time, the single crystalline silicon is grown using a Czochralski (CZ) crystal growth. Further, the mirror-polishing process to the silicon wafer 200 may be performed after subsequent thermal processes.

A first thermal process to the silicon wafer 200 is performed so that oxide elements 203 between the top surface 201 and the backside 202 of the silicon wafer 200 are diffused to the inside. As a result, first and second denuded zones DZ1 and DZ2 and a bulk area BK are formed. The first thermal process may be an RTP (Rapid Thermal Process) or an annealing process using a furnace apparatus. The first thermal process may include the RTP.

To fast diffuse the oxide elements 203 in the top surface 201 and the backside 202 of the silicon wafer 200, the first thermal process is performed at a high temperature using an argon (Ar) gas, a nitrogen (N$_2$) gas, ammonia (NH$_3$) gas or a combination thereof. When the first thermal process is the RTP, the first thermal process is performed at a temperature ranging from 1050° C. to approximately 1150° C. for approximately 10 seconds to approximately 30 seconds. When the first thermal process is the annealing process, the first thermal process is performed at a temperature ranging from 1050° C. to approximately 1150° C. for approximately 100 minutes to approximately 300 minutes.

Next, a second thermal process to the silicon wafer 200 is performed so that the oxide elements 203 in the bulk area BK are bonded. As a result, oxygen precipitate nuclei 204 are generated. Similar to the first thermal process, the second thermal process may be the RTP or the annealing process using a furnace apparatus. The second thermal process may include the RTP.

To easily forming the oxygen precipitate nuclei 204, the second thermal process is performed at a temperature lower than that of the first thermal process using an argon (Ar) gas, a nitrogen (N$_2$) gas, ammonia (NH$_3$) gas, or a combination thereof. When the second thermal process is the RTP, the second thermal process is performed at a temperature ranging from approximately 950° C. to approximately 1000° C. for approximately 10 seconds to approximately 30 seconds. When the second thermal process is the annealing process, the second thermal process is performed at a temperature ranging from approximately 950° C. to approximately 1000° C. for approximately 100 minutes to approximately 200 minutes.

Subsequently, a first annealing process is performed to the silicon wafer 200 after finishing the second thermal process. The first annealing process is performed using a furnace apparatus. By heating the silicon wafer 200 at a predetermined temperature lower than that of the second thermal process, the oxygen precipitate nuclei 204 in the bulk area BK are supplementarily generated, and at the same time, oxygen precipitates 205A are generated. The first annealing process may be performed at a temperature ranging from approximately 750° C. to approximately 800° C. for approximately 100 minutes to approximately 180 minutes. Further, the first annealing process is performed under oxygen (O$_2$) gas atmosphere.

A second annealing process is performed to the silicon wafer 200 after finishing the first annealing process. The second annealing process is also performed using a furnace apparatus. By heating the silicon wafer 200 at a predetermined temperature higher than that of the first annealing process, the oxygen precipitates 205A are enlarged. As a result, enlarged oxygen precipitates 205B are generated. The second annealing process may be performed at a temperature ranging from approximately 1000° C. to approximately 1150° C. for approximately 100 minutes to approximately 180 minutes. Further, the second annealing process is performed under oxygen (O$_2$) gas atmosphere.

Hereinafter, the first and second annealing processes are described in detail. Hereinafter, the first and second annealing processes are referring to as a two-step annealing process.

Figure 6:
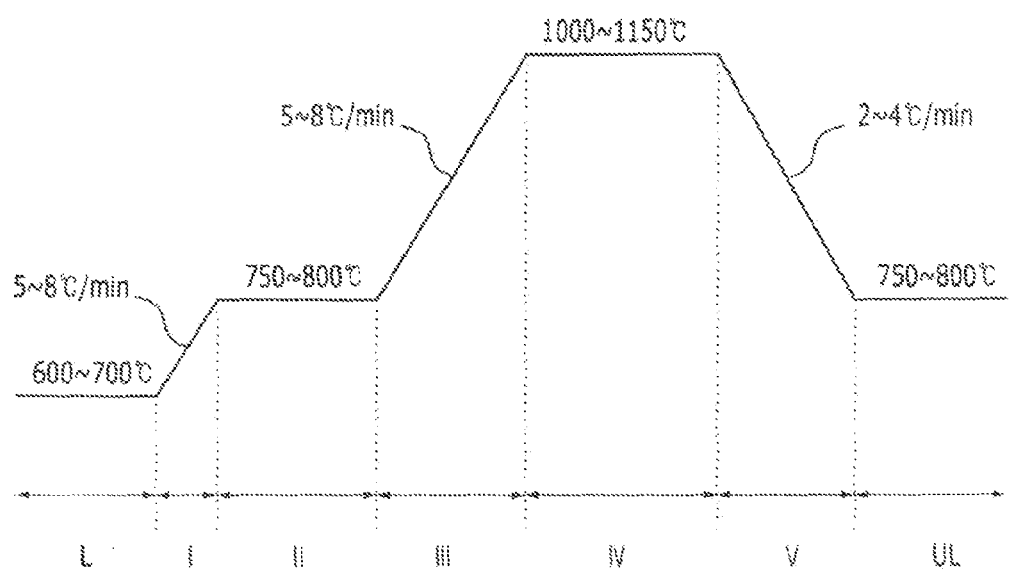
FIG. 6 is a graph illustrating an example of a two-step annealing process method.

FIG. 6 is a graph illustrating an example of a two-step annealing process method. Referring to FIG. 6, the annealing process using a furnace apparatus includes a first annealing process (II) of annealing the silicon wafer 200 at a first temperature using oxygen (O$_2$) gas, and performing a second annealing process (IV) of annealing the silicon wafer 200 at a second temperature higher than the first temperature. Each of the first and second annealing processes (II, IV) is performed for approximately 100 minutes to approximately 180 minutes. The first temperature of the first annealing process (II) ranges from approximately 750° C. to approximately 800° C., and the second temperature of the second annealing process (IV) ranges from approximately 1000° C. to approximately 1150° C.

To improve effects of an oxidation process and a heat treatment process, the two-step annealing process may further include a loading process (L) of loading the silicon wafer 200 into the inside of the furnace apparatus and then maintaining the silicon wafer 200 to a loading temperature for a predetermined duration before the first annealing process (II). Also, after the second annealing process (IV), the two-step annealing process may further include an unloading process (UL) of maintaining the silicon wafer 200 to an unloading temperature for a predetermined duration before the silicon wafer 200 is unloaded from the outside of the furnace apparatus.

The loading temperature of the loading process (L) is lower than that of the first temperature. The loading temperature may range from approximately 600° C. to approximately 700° C. The oxygen gas is not supplied into the furnace apparatus during the loading process (L). Resultantly, the silicon wafer 200 is not oxidized during the loading process (L). The unloading temperature of the unloading process (UL) is substantially equal to the first temperature. The unloading temperature may range from approximately 750° C. to approximately 800° C. During the unloading process (UL), the oxygen gas is not supplied but only a nitrogen gas is supplied. A flow rate of the nitrogen gas ranges from approximately 9 slm to approximately 11 slm.

In addition, the two-step annealing process may further include a first heating-up process (I) for heating up the loading temperature to the first temperature between the loading process (L) and the first annealing process (II), and a second heating-up process (III) for heating up the first temperature to the second temperature between the first annealing process (II) and the second annealing process (IV). When a ramp-up rate per minute is too high during the first and second heating-up processes (I, III), a wafer structure may be deformed. Accordingly, the ramp-up rate in the first and second heating-up processes (I, III) may be set to a range of approximately 5° C./min to approximately 8° C./min.

Also, the two-step annealing process may further include a cooling-down process (V) for cooling down the second temperature to the unloading temperature between the second annealing process (IV) and the unloading process (UL). A ramp-down rate of the cooling-down process (V) may be in the range of approximately 2° C./min to approximately 4° C./min.

In the two-step annealing process, the annealing of the silicon wafer 200 is mostly achieved substantially during the first and second annealing processes (II, IV) because the oxygen gas is only supplied during these processes. A flow rate of the oxygen gas supplied during the first and second annealing processes (II, IV) may range from approximately 50 sccm to approximately 120 sccm. Each of the first and second annealing processes (II, IV) may be performed for approximately 100 minutes to approximately 180 minutes.

Figure 3:
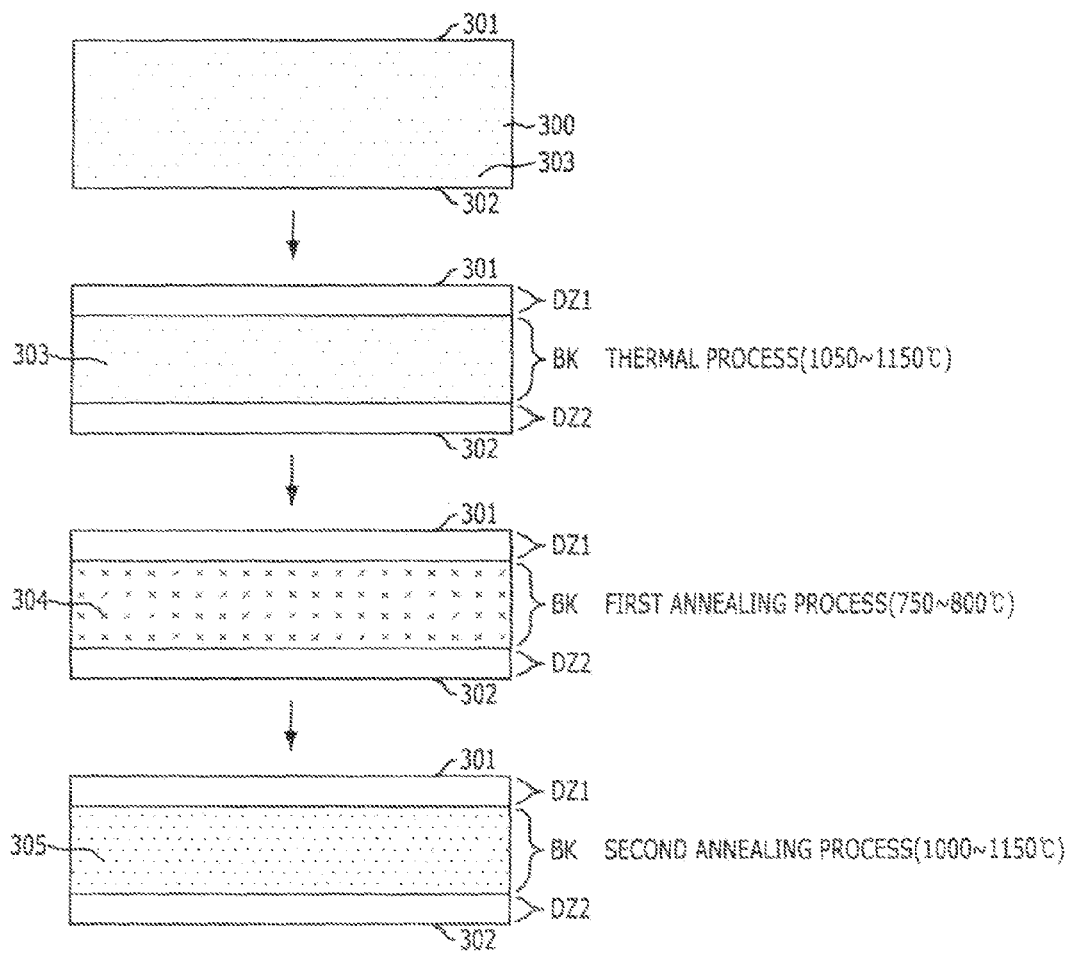
FIG. 3 is a cross-sectional view illustrating another example of a method for fabricating a silicon wafer.
Figure 4:
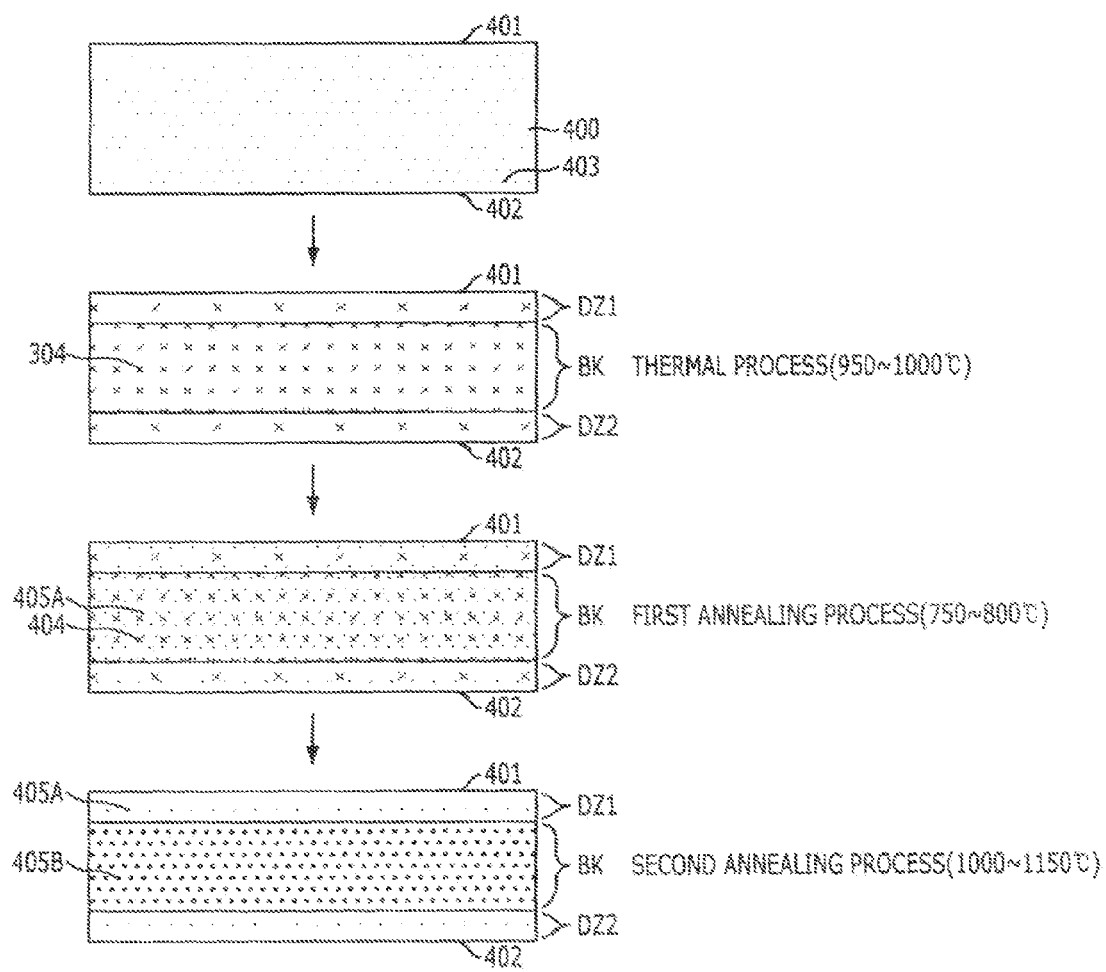
FIG. 4 is a cross-sectional view illustrating yet another example of a method for fabricating a silicon wafer.
Figure 5:
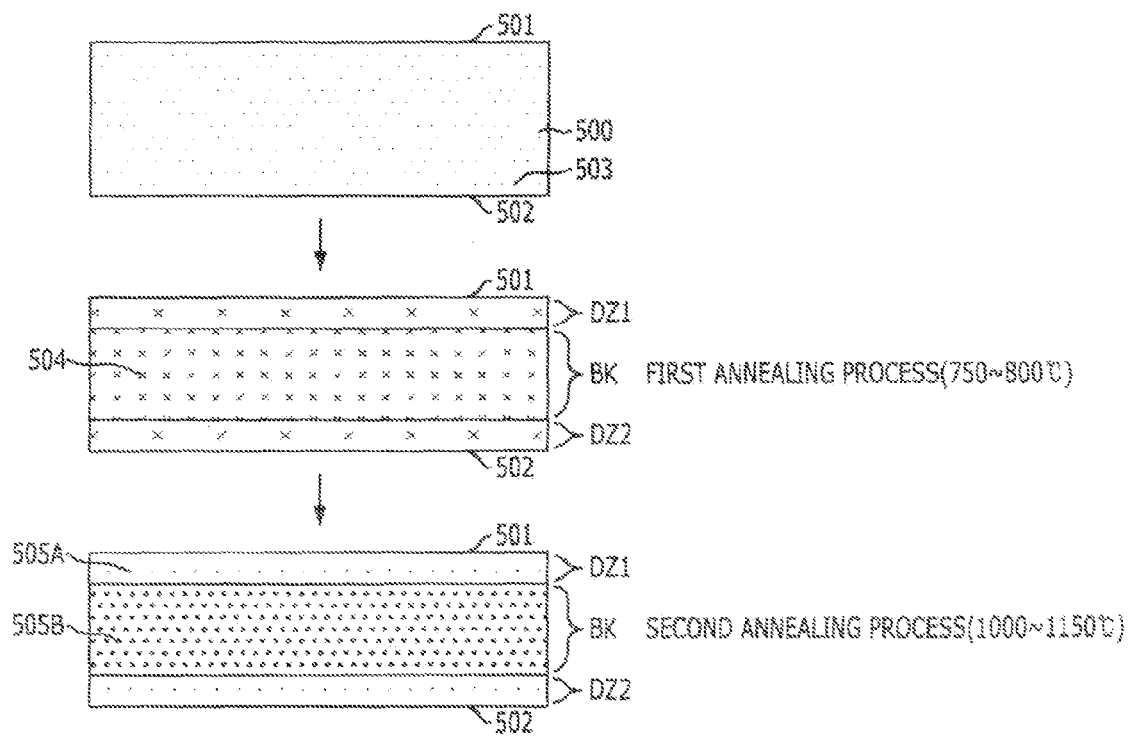
FIG. 5 is a cross-sectional view illustrating still yet another example of a method for fabricating a silicon wafer.

The two-step annealing process as described in FIG. 6 may be applied to the first and second annealing process of a method for fabricating a silicon wafer shown in FIGS. 3 to 5.

FIG. 3 is a cross-sectional view illustrating an example of a method for fabricating a silicon wafer 300. Referring to FIG. 3, a thermal process to the silicon wafer 300 is performed so that oxide elements 303 between a top surface 301 and a backside 302 of the silicon wafer 300 are diffused to the inside. As a result, first and second denuded zones DZ1 and DZ2 and a bulk area BK are formed. The thermal process may be an RTP or an annealing process using a furnace apparatus. The first thermal process may include the RTP.

To fast diffuse the oxide elements 303 of the top surface 301 and the backside 302 of the silicon wafer 300, the thermal process is performed at a high temperature. When the thermal process is the RTP, the thermal process is performed at a temperature ranging from 1050° C. to approximately 1150° C. for approximately 10 seconds to approximately 30 seconds. When the thermal process is the annealing process, the thermal process is performed at a temperature ranging from 1050° C. to approximately 1150° C. for approximately 100 minutes to approximately 200 minutes.

Subsequently, a first annealing process is performed to the silicon wafer 300 so that the oxide elements 203 in the bulk area BK are bonded. As a result, oxygen precipitate nuclei 304 are formed. The first annealing process is performed using a furnace apparatus at a predetermined temperature lower than that of the thermal process. The first annealing process may be performed at a temperature ranging from approximately 750° C. to approximately 800° C. for approximately 100 minutes to approximately 180 minutes. Further, the first annealing process is performed under oxygen ($O_2$) gas atmosphere.

A second annealing process is performed to the silicon wafer 300. The second annealing process is also performed using a furnace apparatus. By heating the silicon wafer 300 at a predetermined temperature higher than that of the first annealing process, oxygen precipitates 305 are generated. The second annealing process may be performed at a temperature ranging from approximately 1000° C. to approximately 1150° C. for approximately 100 minutes to approximately 180 minutes. Further, the second annealing process is performed under oxygen ($O_2$) gas atmosphere.

FIG. 4 is a cross-sectional view illustrating an example of a method for fabricating a silicon wafer 400. In FIG. 4, a thermal process prior to a first annealing process is performed at a temperature lower than that of the thermal process of FIG. 3.

Referring to FIG. 4, the thermal process to the silicon wafer 400 is performed at a temperature lower than that of the thermal process of FIG. 3. Accordingly, oxygen precipitate nuclei 404 are generated. Because the thermal process is performed at a low temperature, the oxygen precipitate nuclei 404 are formed in first and second denuded zones DZ1 and DZ2 as well as a bulk area BK. The thermal process may be an RTP or an annealing process. The first thermal process may include the RTP. When the thermal process is the RTP, the thermal process is performed at a temperature ranging from approximately 950° C. to approximately 1000° C. for approximately 10 seconds to approximately 30 seconds. When the thermal process is the annealing process, the thermal process is performed at a temperature ranging from approximately 950° C. to approximately 1000° C. for approximately 100 minutes to approximately 200 minutes.

Subsequently, first and second annealing processes are sequentially performed to the silicon wafer 400 so that the oxygen precipitate nuclei 404 and oxygen precipitates 405A are generated. The first and second annealing processes are performed under conditions equal to those of the first and second annealing processes of FIG. 3.

FIG. 5 is a cross-sectional view illustrating an example a method for fabricating a silicon wafer 500. Referring to FIG. 5, unlike the annealing processes shown in FIGS. 2 to 4, the annealing process in accordance with the fourth embodiment of the present invention does not require an additional thermal process prior to first and second annealing processes. That is, a silicon wafer 500 of a bare wafer is provided, and the first and second annealing processes are sequentially performed to the silicon wafer 500 so that first and second denuded zones DZ1 and DZ2 and a bulk area BK are formed. The first and second annealing processes are performed under conditions equal to those of the first and second annealing processes shown in FIGS. 2 to 4.

In FIG. 5, a reference '501' denotes a top surface, '502' denotes a backside, '503' denotes oxide elements, '504' denotes oxygen precipitate nuclei, '505A' denotes oxygen precipitates, and '505B' denotes enlarged oxygen precipitates.

As described above, the method for fabricating the silicon wafer in accordance with the present invention is described with reference to FIGS. 2 to 5. As previously stated, in the first to third embodiments shown in FIGS. 2 to 4, the RTP may be used in the thermal process prior to the first and second annealing process.

Internal defects of the oxygen precipitates or void defects in the silicon wafer may be controlled during growing single crystalline silicon, or controlled by the thermal process after growing the single crystalline silicon. As described above, the thermal process may include the RTP using a halogen lamp and the annealing process using a furnace apparatus.

The annealing process using the furnace apparatus is performed at a high temperature greater than approximately 1000° C. for a long time more than approximately 100 minutes under an argon (Ar) gas or hydrogen ($H_2$) atmosphere. Through diffusion of oxide elements in the silicon wafer and a silicon rearrangement by this annealing process, a device perfect zone, i.e., a defect free zone (DFZ), is formed in a portion of the top surface of the silicon wafer. However, this annealing process has difficulties to control contaminations or slip dislocations of the silicon wafer due to a high-temperature heat treatment according as a size of the silicon wafer is increased.

Accordingly, the RTP gets characteristics of the silicon wafer superior to the annealing process. However, when evaluating the silicon wafer fabricated by the RTP using various defects detection method, the oxygen precipitates are controlled only within a depth of approximately 3 μm to approximately 10 μm from the top surface. Further, there is a limit to accomplish high BMD density within the bulk area when the silicon wafer is fabricated by only performing the RTP once or twice. Moreover, when the silicon wafer is fabricated by performing the RTP once, the BMD density is determined within a range from $1\times10^6$ ea/cm$^2$ to $3\times10^6$ ea/cm$^2$, and it is difficult to make the BMD density beyond that.

In the embodiments of the present invention, as shown in FIGS. 2 to 4, the two-step annealing process is performed after the thermal process, thereby removing the void defects and the oxygen precipitates near to the top surface of the silicon wafer. As a result, the present invention can secure a defect free zone (DFZ) and increase the BMD density including bulk stack defects and oxygen precipitates in the bulk area to thereby improve gettering effects by increasing gettering sites in the bulk area.

Hereinafter, referring to Tables 1 and 2, characteristics of the silicon wafer fabricated by the above-referenced examples will be described in detail.

TABLE 1

|  | Condition 1 | Condition 2 | Condition 3 | Condition 4 |
|---|---|---|---|---|
| High Temp. RTP | 1050~1150° C. | 1050~1150° C. | omitted | omitted |
| Low Temp. RTP | 950~1000° C. | omitted | 950~1000° C. | omitted |
| Low Temp. Annealing Process | 750~800° C. | 750~800° C. | 750~800° C. | 750~800° C. |
| High Temp. Annealing Process | 1000~1150° C. | 1000~1150° C. | 1000~1150° C. | 1000~1150° C. |

TABLE 2

|  | Condition 1 | | | Condition 2 | | | Condition 3 | | | Condition 4 | | |
|---|---|---|---|---|---|---|---|---|---|---|---|---|
| Oi (PPMA) | 10.3 | 11.6 | 12.7 | 10.3 | 11.6 | 12.7 | 10.3 | 11.6 | 12.7 | 10.3 | 11.6 | 12.7 |
| BMD density (ea/cm$^2$) | $3.03\times10^6$ | $5.43\times10^6$ | $8.85\times10^6$ | $4.32\times10^5$ | $9.35\times10^5$ | $2.35\times10^6$ | $2.12\times10^5$ | $7.12\times10^5$ | $1.25\times10^6$ | $3.85\times10^5$ | $5.12\times10^5$ | $9.50\times10^5$ |
| DZ depth (μm) | 38.5 | 28.7 | 24.5 | 36.5 | 29.01 | 24.7 | 52.9 | 42.10 | 34.6 | 57.6 | 40.3 | 32.5 |

In Table 1, the 'High Temp. RTP' and 'Low Temp. RTP' are performed under a rapid thermal treatment for approximately 10 seconds to approximately 30 seconds using an argon (Ar) gas, a nitrogen ($N_2$) gas, an ammonia ($NH_3$) gas, or a combination thereof. The 'Low Temp Annealing Process' and 'High Temp Annealing Process' are performed for approximately 100 minutes to approximately 180 minutes using oxygen ($O_2$) gas.

In Tables 1 and 2, the 'Condition 1' denotes the example shown in FIG. 2, the 'Condition 2' denotes the example shown in FIG. 3, the 'Condition 3' denotes the example shown in FIG. 4, and the 'Condition 4' denotes the example shown in FIG. 5. Table 2 shows the BMD density and the denuded zone (DZ) depth according to oxygen concentration (Oi) in each condition.

Figure 7:
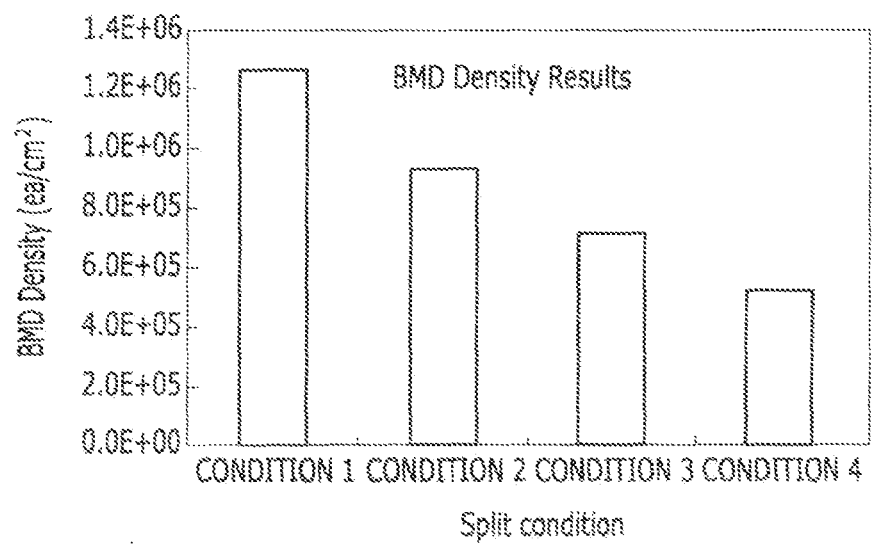
FIG. 7 is a graph illustrating an example of a BMD density under various conditions.
Figure 8:
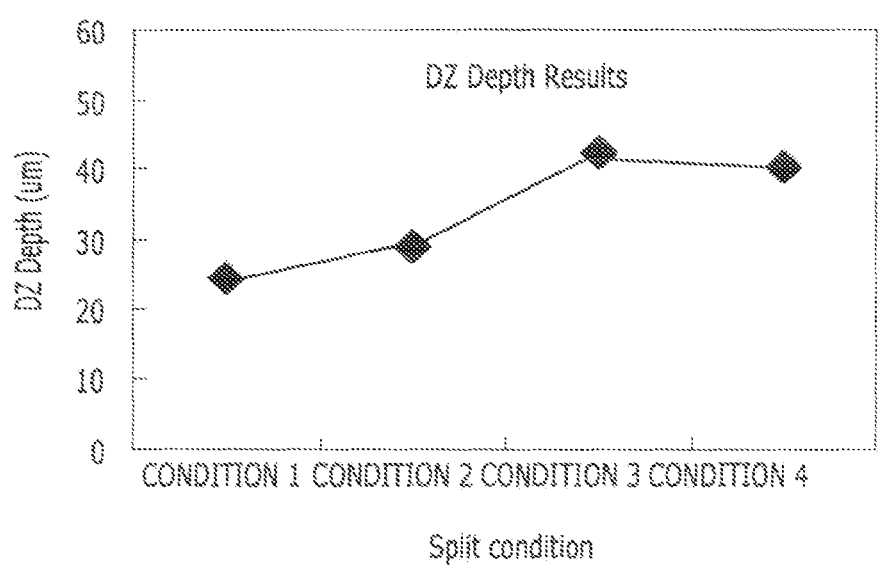
FIG. 8 is a graph illustrating an example of a depth of a denude zone under various conditions.
Figure 9:
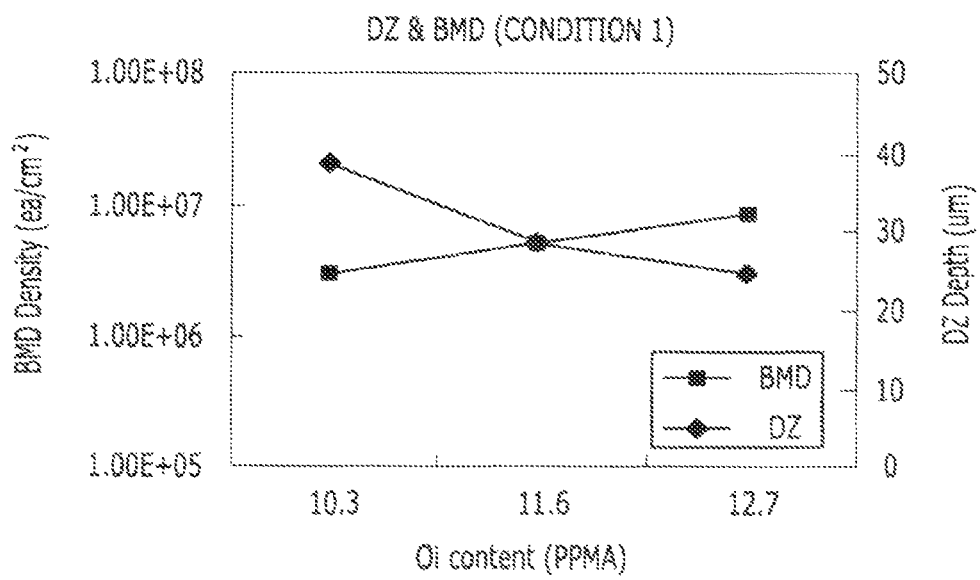
FIGS. 9 to 12 are graphs illustrating examples of a BMD density and a depth of a denude zone according to a concentration of oxygen under various conditions.
Figure 10:
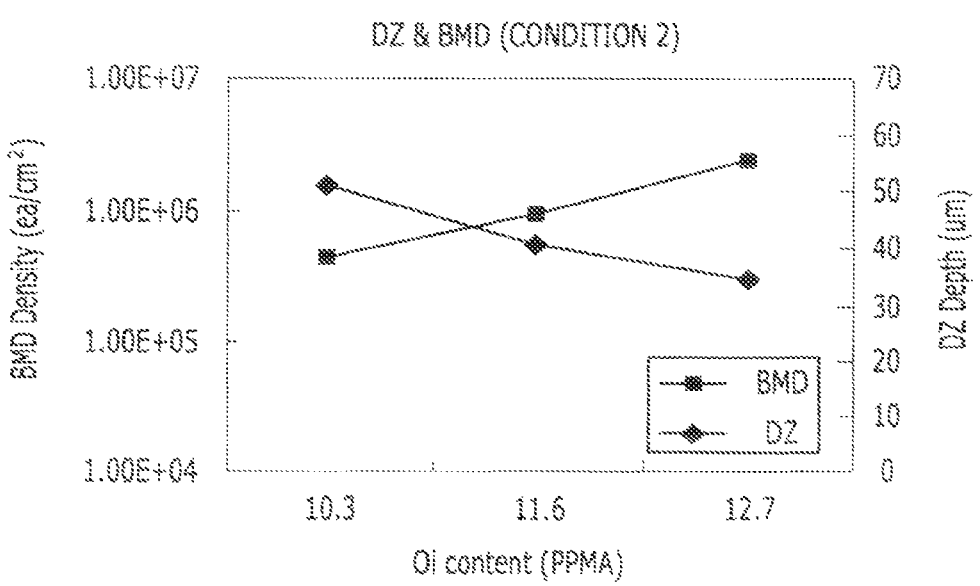
Figure 11:
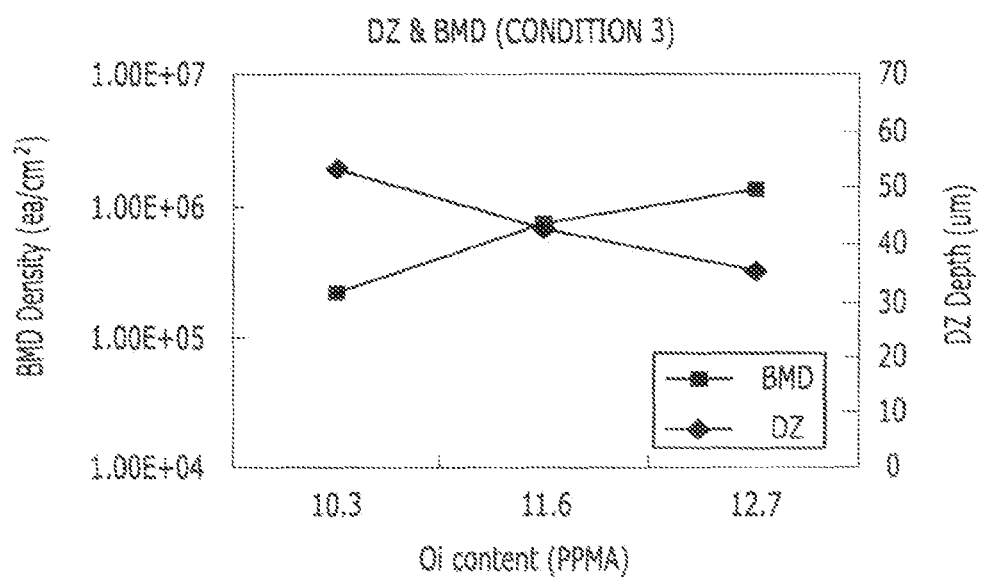
Figure 12:
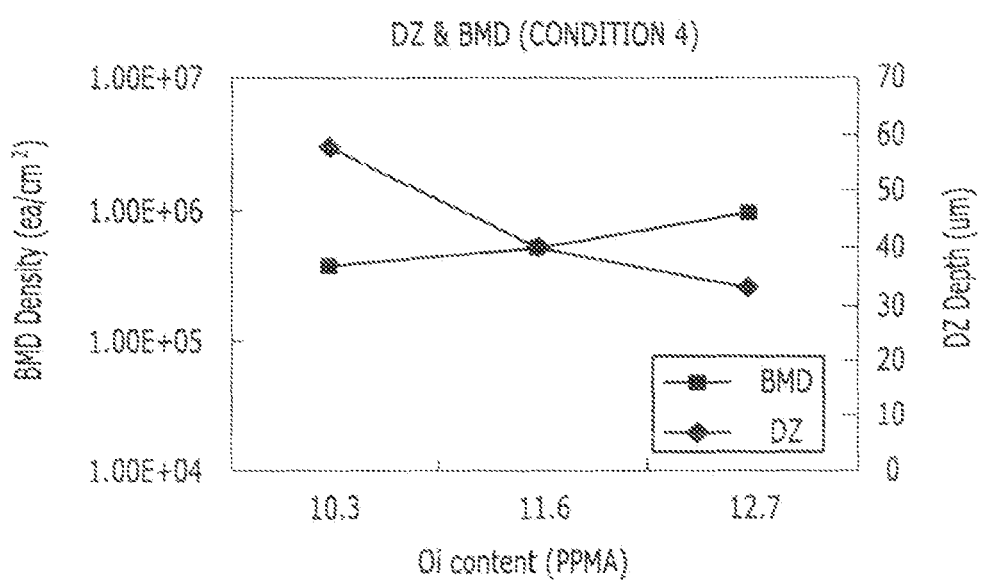

FIGS. 7 to 12 are graphs showing parameters of Tables 1 and 2. FIG. 7 is a graph illustrating the BMD density with respect to each condition. FIG. 8 is a graph illustrating the DZ depth with respect to each condition. FIGS. 9 to 12 are graphs illustrating the oxygen concentration in the bulk area with respect to each condition.

Referring to Table 2 and FIG. 7, the BMD density greater than $1\times10^5$ ea/cm$^2$ is obtained under all the conditions. The BMD density more than $1\times10^6$ ea/cm$^2$ is obtained under Condition 1 regardless of the oxygen concentration. Though data relating to the BMD density of the silicon wafer, which is fabricated by only performing the RTP once or twice, are not presented, it is predictable that the BMD density may be significantly lower in comparison with the BMD density under the above conditions.

As previously stated, the metallic contaminations are controlled by gettering the BMDs. However, because the BMD density has a tendency to be decreased during a high-temperature process, it requires securing high BMD density during fabricating the silicon wafer. In general, a semiconductor device needs high-voltage devices operating under high-voltage circumstances. To fabricate this high-voltage device, a severe ion implantation process and a high-temperature annealing process are necessarily performed because a junction region, i.e., a doping region, having a deep profile is required. When the BMD density is decreased during the high-temperature annealing process, a ring-shaped dislocation occurs after following shallow trench isolation (STI) due to not only defects evaluation but also low gettering ability.

As a result of measuring the BMD density, the ring-shaped dislocation partially occurs when the BMD density is approximately $2.5 \times 10^5$ ea/cm$^2$, but does not occur when the BMD density is approximately $4.4 \times 10^5$ ea/cm$^2$. Therefore, it requires controlling the BMD density to be greater than at least $1 \times 10^5$ ea/cm$^2$. For example, regardless of the conventional thermal process during fabricating the silicon wafer, the two-step annealing process is additionally performed for an initial process for fabricating the semiconductor device. The initial process includes an oxidation process which is performed prior to an ion plantation for forming a well. The oxidation process corresponds to a process for forming a screen oxide layer during an ion plantation for forming a well (hereinafter being referred to as a well ion plantation).

Referring to Table 2 and FIG. 8, the DZ depth according to each condition is shown. The DZ depth is closely related to the BMD density and the oxygen concentration. As the BMD density and the oxygen concentration are increased, the DZ depth becomes decreased. When the oxygen concentration is the same under each condition, e.g., 11.6 in Table 2, the BMD density in the conditions 1 and 2 is greater than that of the conditions 3 and 4, but the DZ depth in the conditions 1 and 2 is less than that of the conditions 3 and 4. Accordingly, the DZ depth may be a measure of the BMD density.

Referring to Table 2 and FIGS. 9 to 12, the BMD density and the DZ depth according to the oxygen concentration under each condition are shown. As the oxygen concentration (Oi) is increased, the BMD density becomes increased but the DZ depth becomes decreased. Accordingly, the oxygen concentration (Oi) is also a measure of the BMD density. That is, the BMD density in the bulk area may be calculated by measuring the DZ depth and the oxygen concentration (Oi).

Figure 13:
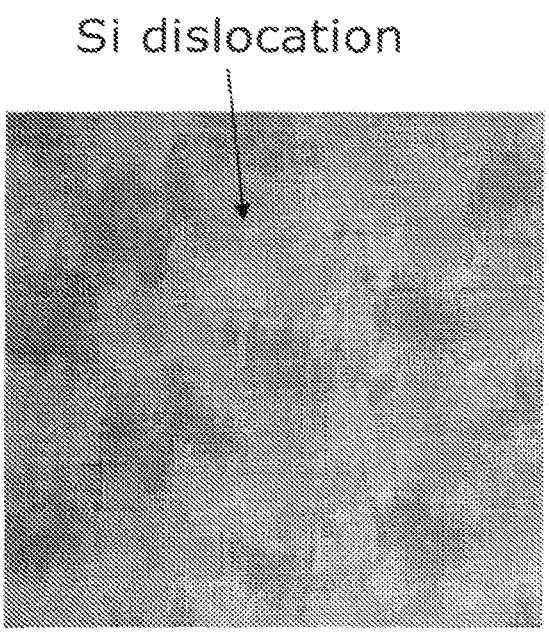
FIG. 13 is a cross-sectional view illustrating a silicon wafer fabricated according to a comparative example.
Figure 14:
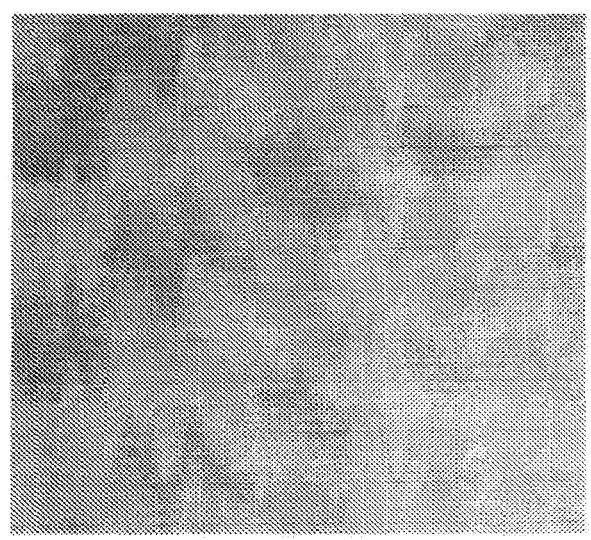
FIG. 14 is a cross-sectional view illustrating a silicon wafer fabricated in accordance with an example embodiment.

FIGS. 13 and 14 are cross-sectional views of a silicon wafer. FIG. 13 shows a cross-sectional view of a silicon wafer fabricated by performing only an RTP without a two-step annealing process, and FIG. 14 shows a cross-sectional view of a silicon wafer fabricated by performing a two-step annealing process in accordance with an example embodiment.

As shown, a plurality of silicon dislocations occur in the silicon wafer of FIG. 13, but there are no silicon dislocations in the silicon wafer of FIG. 14. Further, when forming an epitaxial layer by using an epitaxial growth, crystal defects in the bulk area of the silicon wafer where the epitaxial layer is formed are significantly reduced.

Figure 15:
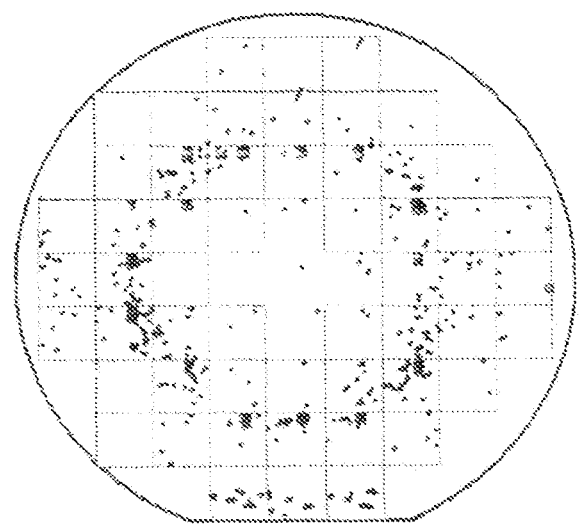
FIG. 15 is a crystal defect map illustrating a comparative example of a bulk area in a silicon wafer fabricated.
Figure 16:
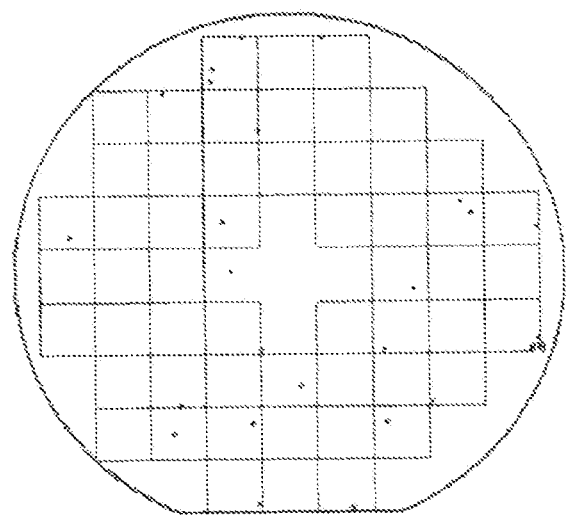
FIG. 16 is a crystal defect map illustrating an example of a bulk area in a silicon wafer fabricated by using a two-step annealing process.

FIGS. 15 and 16 illustrate crystal defect maps of the bulk area in the silicon wafer where the epitaxial layer is formed. This inspection is performed using an inspection apparatus fabricated by KLA Corporation.

As shown in FIG. 15, many crystal defects are distributed in the map when performing an oxidation process without the two-step annealing process. Herein, the oxidation process forms a screen oxide layer during a well ion plantation. On the contrary, as shown in FIG. 16, crystal defects are significantly decreased when performing the oxidation process with the two-step annealing process.

Hereinafter, referring to FIGS. 17A to 17D, a method of fabricating a semiconductor device having a well for a high-voltage device will be described in detail, the method including a two-step annealing process. FIGS. 17A to 17D are cross-sectional views illustrating an example of a method of fabricating a semiconductor device.

Figure 17A:
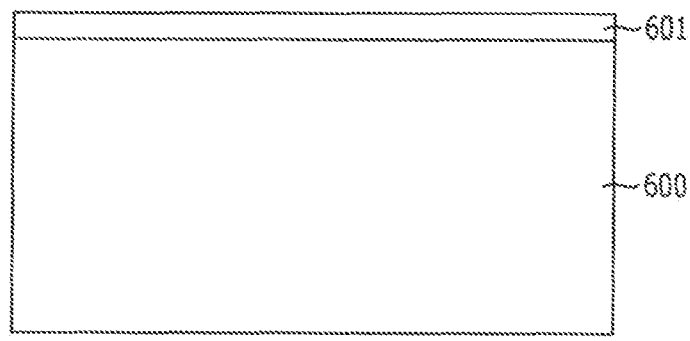
FIGS. 17A to 17D are cross-sectional views illustrating an example of a method for fabricating a semiconductor device.

Referring to FIG. 17A, a screen oxide layer 601 is formed on a silicon wafer 600 using the two-step annealing process shown in FIG. 6. The silicon wafer 600 may be a wafer to which the RTP is applied once or twice as described in FIGS. 2 to 4, or a bare wafer to which no RTP is applied as described in FIG. 5. The screen oxide layer 601 may be a silicon oxide layer, and formed to a thickness ranging from approximately 100 Å to approximately 140 Å.

Figure 17B:
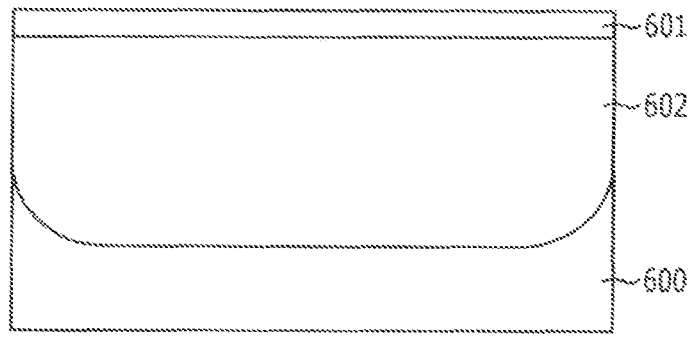

Referring to FIG. 17B, a well 602 is formed to a predetermined depth in the silicon wafer 600. The well 602 may have a p-type or an n-type conductive type depending on the conductive type of a high-voltage device.

The well 602 is formed through an ion implantation process and a diffusion process. It is difficult to form a well for a high-voltage device using only the ion implantation process. Therefore, the diffusion process as well as the ion implantation process should be performed additionally after completing the ion implantation process in order to form the well 602 having a doping profile of FIG. 17B. The diffusion process is performed for a long time through an annealing process using a high-temperature heating apparatus such as a furnace. The diffusion process may be performed at a temperature ranging from 1100° C. to approximately 1250° C. for approximately 6 hours to approximately 10 hours using only a nitrogen ($N_2$) gas.

Figure 17C:
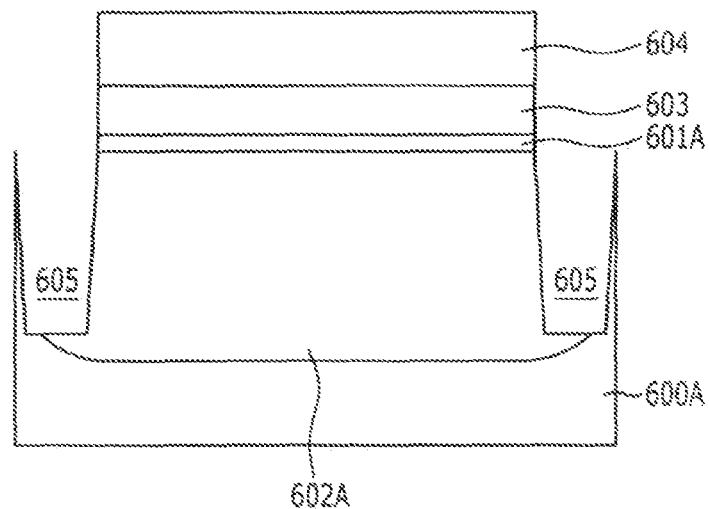

Referring to FIG. 17C, a pad nitride layer (not shown) acting as a hard mask is formed on the screen oxide layer 601, or the pad nitride layer is formed on a buffer layer (not shown) which is formed by performing an additional oxidation process after removing the screen oxide layer 601. The reason why the screen oxide layer 601 is removed is that the screen oxide layer 601 is improper to a buffer layer because it gets damaged during the ion implantation process. A photoresist pattern 604 for forming an STI trench is then formed on the pad nitride layer.

The pad nitride layer may be formed through a low pressure chemical vapor deposition (LPCVD) process so as to prevent the silicon wafer 600 from being damaged by minimizing stress applied to the silicon wafer 600 during a deposition process. The pad nitride layer may be formed of silicon nitride. The pad nitride layer may be formed to a thickness ranging from approximately 1400 Å to approximately 2000 Å.

The pad nitride layer, the screen oxide layer 601 and the silicon wafer 600 are partially etched in sequence using the photoresist pattern 604 as an etch mask, thereby forming a pad nitride pattern 603, a screen oxide pattern 601A, a silicon wafer 600A and a well 602A. As a result, a trench 605 having a predetermined depth and slope angle is formed in the silicon wafer 600A.

Figure 17D:
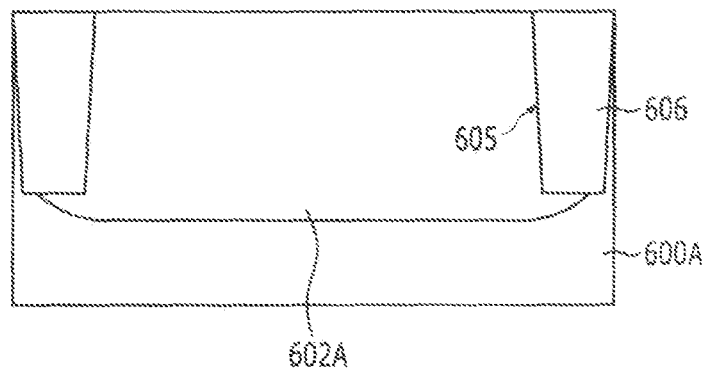

Referring to FIG. 17D, a device isolation structure 606 filling the trench 605 is formed and thereafter, the pad nitride pattern 603 and the screen oxide pattern 601A are removed.

The device isolation structure 606 may be formed of a high density plasma (HDP) layer having good gap-fill property.

According to teachings above, examples are provided of methods of fabricating a silicon wafer by forming the screen oxide layer through an oxidation process using the two-step annealing process, which may have advantageous effects compared with those provided by a comparative example. The comparative example includes forming the screen oxide layer through an oxidation process using one-step annealing process. In the oxidation process of this comparative example, the silicon wafer was oxidized at a single temperature ranging from 800° C. to 850° C. using a wet oxidation process.

FIGS. 18 to 21 illustrate defects in silicon wafers prepared by an oxidation process of the comparative example.

Figure 18:
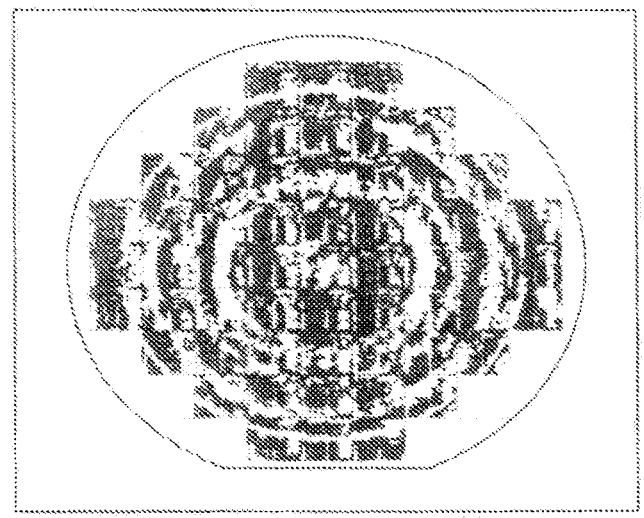
FIG. 18 illustrates an inspection result of crystal defects in a silicon wafer prepared according to a comparative example.

FIG. 18 illustrates map data of crystal defects inspected by an inspection apparatus fabricated by KLA Corporation after forming a trench through an STI process in a silicon wafer prepared by the oxidation process of the comparative example. As shown in FIG. 18, it can be observed that crystal defects such as ring-shaped silicon dislocations exist in most of defective wafers.

Figure 19:
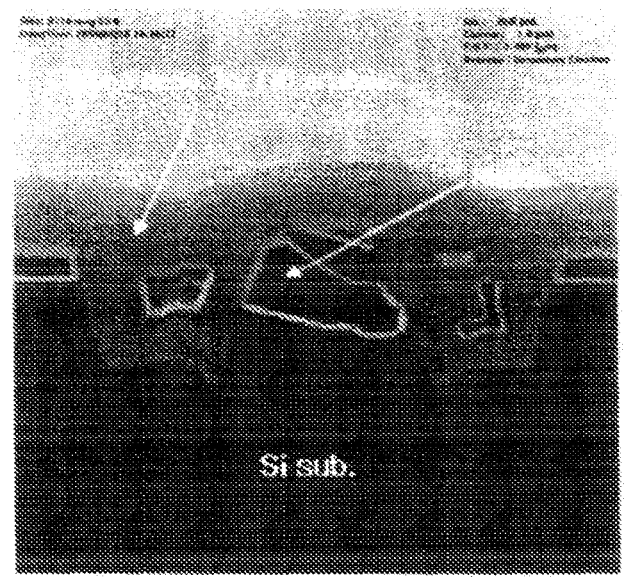
FIG. 19 is a scanning electron microscopic (SEM) picture of a silicon wafer prepared by an oxidation process of the comparative example.
Figure 20:
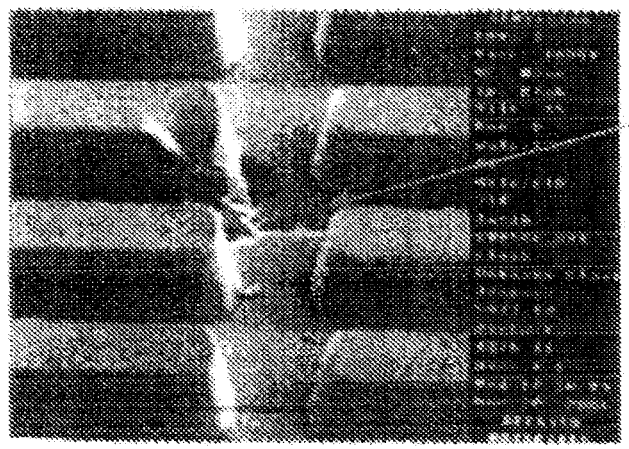
FIG. 20 is a plan image illustrating a comparative example of a silicon wafer prepared by an oxidation process.

FIGS. 19 and 20 are scanning electron microscopic (SEM) pictures of a silicon wafer taken by an inspection apparatus fabricated by KLA Corporation. FIG. 19 is a SEM image showing a section of the silicon wafer, and FIG. 20 is a plan-tilt STM image. As shown FIGS. 19 and 20, it can be observed that there are crystal defects and dislocations.

Figure 21:
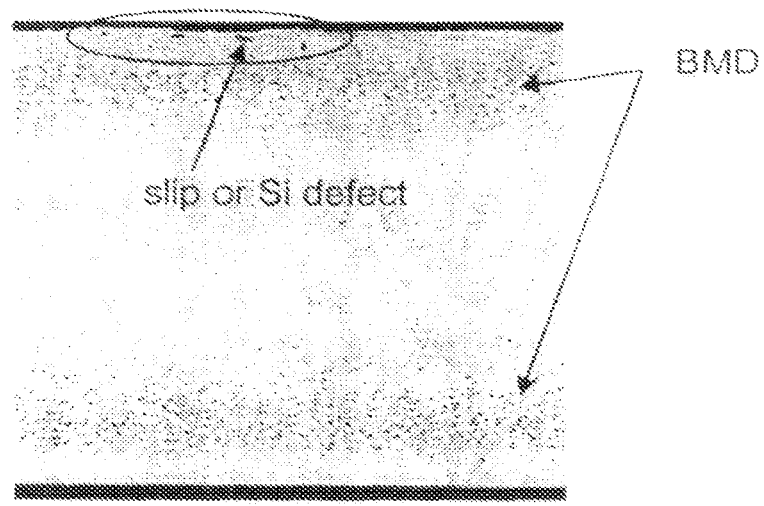
FIG. 21 is a microscopic picture showing a BMD density analysis on a silicon wafer prepared by an oxidation process of the comparative example.

FIG. 21 is a micrograph showing a bulk micro-defect (BMD) density analysis on a silicon wafer having ring-shaped defects. As shown in FIG. 21, it can be observed that most BMDs are closely formed to a top surface of the silicon wafer but few BMDs are formed in a central portion of the silicon wafer, i.e., in the bulk area. That is, the BMD density of the bulk area is significantly less than that of the top surface of the silicon wafer.

Figure 22:
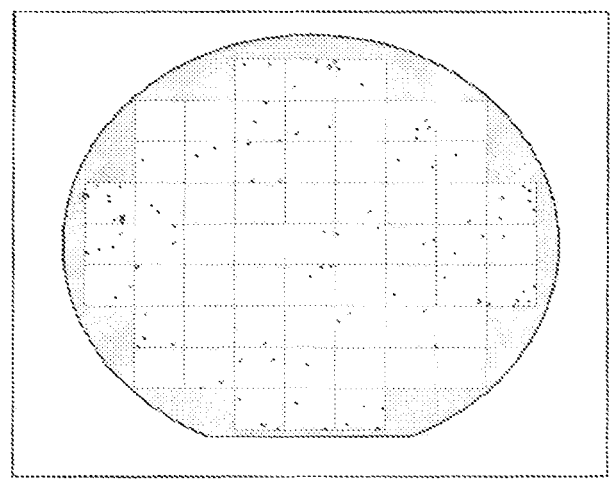
FIG. 22 illustrates an inspection result for crystal defects of a silicon wafer in accordance with an example embodiment.
Figure 23:
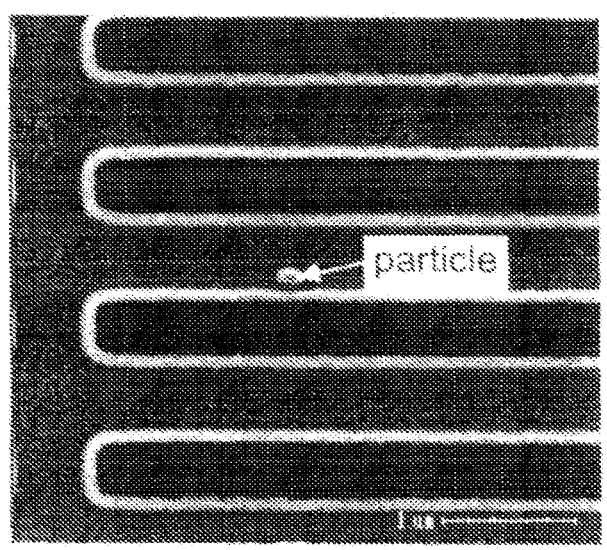
FIG. 23 is a plan image illustrating an example of a silicon wafer.
Figure 24:
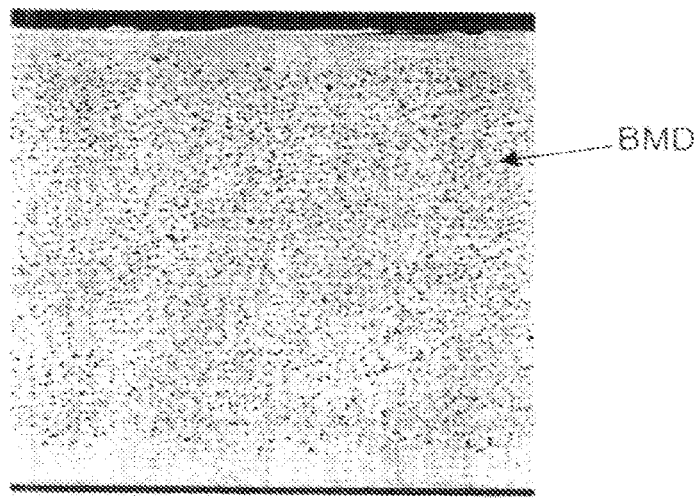
FIG. 24 is a micrograph showing a BMD density analysis on a silicon wafer in accordance with an example embodiment.

FIGS. 22 to 24 are an inspection result of crystal defects in a silicon wafer prepared by an oxidation process using a two-step annealing process in accordance with example embodiment. This inspection is performed using an inspection apparatus fabricated by KLA Corporation.

FIG. 22 illustrates an inspection result of crystal defects of a silicon wafer after forming a trench through an STI process in the silicon wafer prepared by an oxidation process using a two-step annealing process. As shown in FIG. 22, it can be observed that crystal defects are removed, and only some particles or dusts are detected.

FIG. 23 is a plan tilt STM image of a silicon wafer taken by an inspection apparatus fabricated by KLA Corporation. As similar to the result of FIG. 22, it can be observed that only some particles are detected.

FIG. 24 is a micrograph showing a BMD density analysis on a silicon wafer prepared by an oxidation process using a two-step annealing process. As shown in FIG. 24, it can be observed that BMDs are uniformly formed over the silicon wafer.

Figure 25:
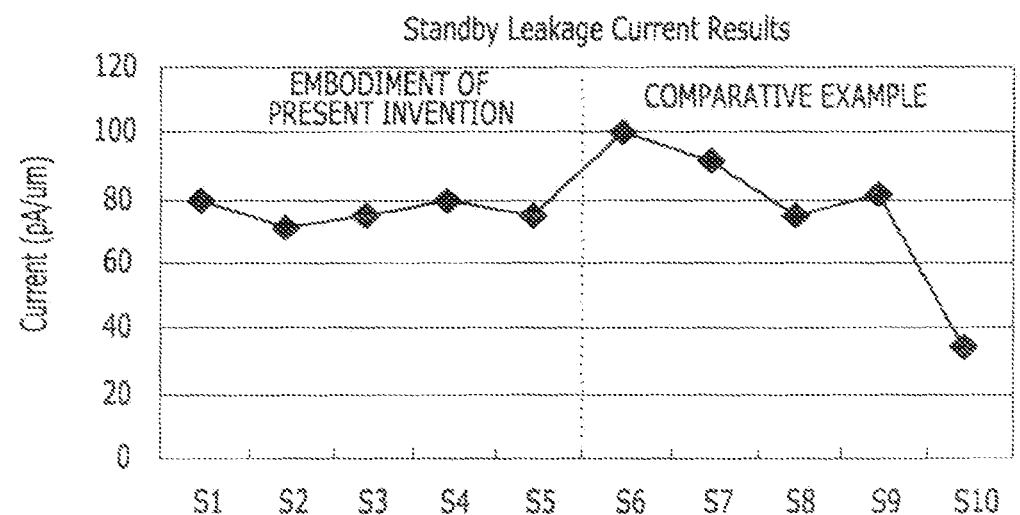
FIG. 25 is a graph illustrating an example of comparison results of leakage current during a standby mode of a Static Random Access Memory (SRAM).

FIG. 25 is a graph illustrating comparison results of leakage current during a standby mode of a static random access memory (SRAM). In FIG. 25, the left view shows samples of high-voltage devices prepared by the oxidation process using the two-step annealing process, and the right view shows samples of high-voltage devices of the comparative example. As shown in FIG. 25, it can be observed that the samples prepared by the oxidation process of the present invention exhibit uniform leakage current characteristic in comparison with the samples prepared by the oxidation process of the comparative example.

Figure 26:
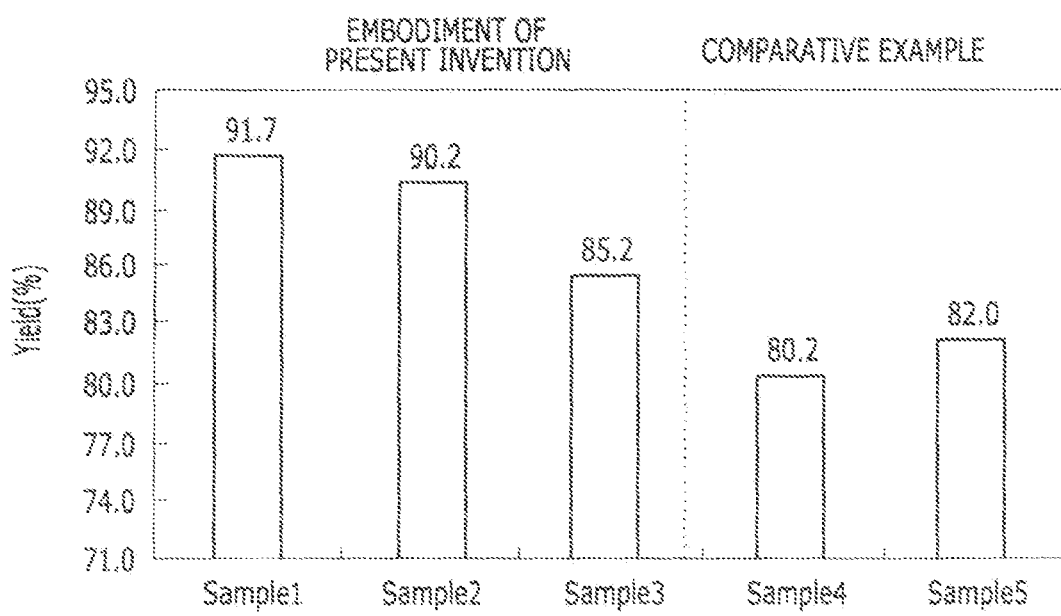
FIG. 26 is a graph illustrating comparison results of production yield.

FIG. 26 is a graph illustrating comparison results of production yield. In FIG. 26, the left view shows samples of high-voltage devices prepared by the oxidation process using the two-step annealing process, and the right view shows samples of high-voltage devices of the comparative example. As shown in FIG. 26, it can be observed that the production yield of the samples prepared by the oxidation process using the two-step annealing process is greater by approximately 5-9% than the samples of the comparative example.

According to teachings above, there is provided a silicon wafer and a fabrication method thereof in which gettering sites may be sufficiently produced in a silicon wafer by performing a two-step annealing process at different temperatures. This makes it possible to prevent crystal defects from being generated due to a thermal budget caused by a following high-temperature heat treatment process.

According to teachings above, there is provided a silicon wafer and a fabrication method thereof that may have high and uniform BMD density in a bulk area by performing a two-step annealing process at different temperatures.

According to teachings above, there is provided a silicon wafer and a fabrication method thereof in which an epitaxial layer is formed over the silicon wafer using an epitaxial growth after performing a two-step annealing process to the silicon wafer at different temperatures. As a result, a semiconductor device to which the epitaxial layer of excellent characteristics is formed may be provided.

According to teachings above, there is provided a silicon wafer and a fabrication method thereof in which, after a screen oxide layer is formed over the silicon wafer by performing a two-step annealing process to the silicon wafer at different temperatures, a well is formed in the silicon wafer by performing an ion implantation process using the screen oxide layer as an ion mask. As a result, gettering sites in the silicon wafer may be sufficiently produced to thereby prevent crystal defects from being generated due to a thermal budget caused by a following high-temperature heat treatment process.

According to teachings above, there is provided a silicon wafer and a fabrication method thereof in which high and uniform BMD density may be accomplished in a bulk area using a two-step annealing process to the silicon wafer. As a result, crystal defects may be prevented from being generated due to a thermal budget caused by a following high-temperature heat treatment process by sufficiently increasing gettering sites.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of fabricating a silicon wafer, comprising:
   thermally processing the silicon wafer to form a denuded zone and a bulk area in the silicon wafer;
   loading the thermally processed silicon wafer into a heating apparatus at a loading temperature and performing a first annealing process on the silicon wafer at a first temperature to supplementally generate oxygen precipitate nuclei and oxygen precipitates in the bulk area; and
   performing a second annealing process on the silicon wafer at a second temperature higher than the first temperature to enlarge the oxygen precipitates in the bulk area, wherein the thermally processing of the silicon wafer occurs prior to the loading of the thermally processed silicon wafer; and the thermally processing of the silicon wafer comprises performing a first thermal process and a second thermal process on the silicon wafer, the second thermal process being performed at a lower temperature than the first thermal process and forming the oxygen precipitate nuclei in the bulk area.

2. The method of claim 1, wherein the first annealing process is performed at a temperature ranging from approximately 750° C. to approximately 800° C.

3. The method of claim 1, wherein the second annealing process is performed at a temperature ranging from approximately 1000° C. to approximately 1150° C.

4. The method of claim 1, wherein the first thermal process is performed on the silicon wafer at a third temperature equal to or less than the second temperature to form the denuded zone and the bulk area; and the second thermal process is performed on the silicon wafer at a fourth temperature greater than the first temperature and less than the third temperature to form the oxygen precipitate nuclei in the bulk area.

5. The method of claim 4, wherein the first and second thermal processes are performed by a rapid thermal process (RTP) or an annealing process.

6. The method of claim 4, wherein:

the first thermal process is performed at a temperature ranging from approximately 1050° C. to approximately 1150° C.; and the second thermal process is performed at a temperature ranging from approximately 950° C. to approximately 1000° C.

7. The method of claim 4, wherein the first and second thermal processes use an argon (Ar) gas, a nitrogen ($N_2$) gas, an ammonia ($NH_3$) gas, or a combination thereof.

8. The method of claim 1, wherein the first thermal process is performed on the silicon wafer at a third temperature equal to or less than the second temperature to form the denuded zone and the bulk area.

9. The method of claim 8, wherein the first thermal process is performed at a temperature ranging from approximately 1050° C. to approximately 1150° C.

10. The method of claim 1, wherein the second thermal process is performed on the silicon wafer at a third temperature greater than the first temperature and less than the second temperature to form the denuded zone and the bulk area.

11. The method of claim 10, wherein the second thermal process is performed at a temperature ranging from approximately 950° C. to approximately 1000° C.

12. The method of claim 1, wherein the first and second annealing processes are performed under oxygen ($O_2$) gas atmosphere.

13. The method of claim 1, wherein each of the first and second annealing processes is performed for approximately 100 minutes to approximately 180 minutes.

14. The method of claim 1, wherein the denuded zone is formed with a depth ranging from approximately 20 μm to approximately 80 μm from a top surface of the silicon wafer.

15. The method of claim 1, wherein, after the performing of the second annealing process, a density of a bulk micro defect (BMD) including the oxygen precipitates in the bulk area is controlled to range from approximately $1\times10^5$ ea/cm$^2$ to approximately $1\times10^7$ ea/cm$^2$.

16. The method of claim 1, wherein, after the performing of the second annealing process, a concentration of oxygen in the bulk area is controlled to be uniformly distributed within a variation of 10% over the bulk area.

17. The method of claim 1, wherein, after the performing of the second annealing process, a concentration of oxygen in the bulk area is controlled to range from approximately 10.5 to approximately 13 PPMA.

18. The method of claim 1, further comprising:

removing an oxide layer formed over a top surface of the silicon wafer during the second annealing process; and forming an epitaxial layer over the top surface of the silicon wafer through an epitaxial growth.

19. The method of claim 1, further comprising:

forming a well in the silicon wafer by using an oxide layer as a buffer layer, the oxide layer being formed over a top surface of the silicon wafer during the second annealing process.

20. The method of claim 1, further comprising providing the silicon wafer for the thermal processing to form the denuded zone and the bulk area, the providing of the silicon wafer comprising:

growing a single crystalline silicon;

slicing the grown single crystalline silicon in a shape of wafer; and performing an etching process to etch surface of the sliced silicon wafer or to round a side of the sliced silicon wafer.

* * * * *